United States Patent
Chang

(10) Patent No.: US 7,240,302 B1
(45) Date of Patent: Jul. 3, 2007

(54) METHOD AND APPARATUS FOR RELOCATING ELEMENTS IN A FLOORPLAN EDITOR

(75) Inventor: Albert Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 153 days.

(21) Appl. No.: 11/021,841

(22) Filed: Dec. 23, 2004

(51) Int. Cl.
 *G06F 17/50* (2006.01)
(52) U.S. Cl. .................. 716/2; 716/9; 716/12
(58) Field of Classification Search .............. 716/2, 716/9, 11, 12, 17, 18
See application file for complete search history.

(56) References Cited

U.S. PATENT DOCUMENTS

2003/0149962 A1* 8/2003 Willis et al. ................ 717/135

* cited by examiner

*Primary Examiner*—Thuan Do
(74) *Attorney, Agent, or Firm*—Martine Penilla & Gencarella, LLP

(57) ABSTRACT

A method for modifying a compiled integrated circuit floorplan is provided. A non-optimally placed functional element within the floorplan is identified and then moved to a tray region outside of the integrated circuit floorplan. A location to move the non-optimally placed functional element is identified. In one embodiment, the location to move the non-optimally placed functional element is not viewable in the same display as the original location of the non-optimally placed functional element. The non-optimally placed functional element is then relocated from the tray region to a new location within the floorplan. The modified floorplan may be recompiled upon relocation of the functional element. A computer readable medium, a graphical user interface, and a system for designing an integrated circuit are also provided.

14 Claims, 10 Drawing Sheets

Fig. 4

METHOD AND APPARATUS FOR RELOCATING ELEMENTS IN A FLOORPLAN EDITOR

BACKGROUND

1. Field of the Invention

This invention relates generally to integrated circuit design and, in particular, to placing functional elements within an integrated circuit floorplan.

2. Description of the Related Art

For the design of digital circuits on the scale of VLSI (Very Large Scale Integration) technology, designers often employ computer-aided techniques. Standard languages known as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL), or the behavioral level using abstract data types. As device technology continues to advance, various product design tools have been developed to adapt HDLs for use with newer devices and design styles.

In designing circuits using HDL compilers, designers first describe circuit elements in HDL source code and then compile the source code to produce synthesized RTL netlists. The RTL netlists correspond to schematic representations of the circuit elements. The circuits containing the synthesized circuit elements are often optimized to improve timing relationships and eliminate unnecessary or redundant logic elements. Such optimization typically involves substituting different gate types or combining and eliminating gates in the circuit, and often results in re-ordering the hierarchies and relationships between the original RTL objects and the underlying source code that produced the RTL objects.

One operation, which is often desirable in this process, is to plan the layout of a particular integrated circuit, to control timing problems and to manage interconnections between regions of an integrated circuit. This is sometimes referred to as "floorplanning." A typical floorplanning operation divides the circuit area of an integrated circuit into regions, sometimes called "blocks," and then assigns logic to reside in a block. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

Once the placement and routing operations have been applied to the floorplan, there may be adjustments that are necessary to accommodate timing constraints not satisfied through the placement and routing design software. These designs, while being close to being complete, may require hand placement for fine-tuning. However, in order to visibly see and have access to the functional element in the floorplan, the floorplan must be greatly expanded. As a result, only a small fraction of the floorplan will be viewed on the display monitor. To move a functional element from one end of the floorplan to another end, the functional element will have to be dragged while scrolling from one end of the floorplan to the other. The scrolling is a slow process. Additionally, moving a large number of functional elements becomes even more difficult because of the repeated slow scrolling.

As a result, there is a need to solve the problems of the prior art to more efficiently fine tune a floorplan design of an integrated circuit.

SUMMARY

Broadly speaking, the present invention fills these needs by providing a method and apparatus for more efficiently placing functional elements within an integrated circuit floorplan. It should be appreciated that the present invention can be implemented in numerous ways, including as a method, a system, or a computer readable medium. Several inventive embodiments of the present invention are described below.

In one aspect of the invention a method for modifying a compiled integrated circuit floorplan is provided. In the method, a functional element that has to be moved within the floorplan is identified. The functional element is moved to a tray region outside of the integrated circuit floorplan. A new location within the floorplan to move the functional element is identified. In one embodiment, the new location to move the functional element is not viewable in the same display as the original location of the functional element. Thus, a designer is free to quickly move to the new location without having to drag the functional element along. The functional element is then relocated from the tray region to the new location within the floorplan. The modified floorplan may be recompiled upon relocation of the functional element. In one embodiment, the method is incorporated as program instructions on a computer readable medium.

In another aspect of the invention, a computer-implemented system for designing an integrated circuit is provided. The system includes a bus, a memory, and a monitor. The monitor is capable of displaying a floorplan of an integrated circuit and a tray region outside the floorplan. The system includes a processor in communication with the memory and the monitor through the bus. The processor receives instructions that cause the processor to a) identify a functional element in a first location of the floorplan that needs to be relocated; b) temporarily move the functional element to the tray region; and c) identify a new location within the floorplan to relocate the functional element from the tray region.

In still another aspect of the invention, a graphical user interface (GUI) is provided. The GUI includes a window having an enlarged partial floorplan of an integrated circuit design. The GUI includes a tray window capable of storing a functional element of the integrated circuit design that has been removed from the enlarged partial floorplan. The functional element is stored in the tray window during movement between the partial floorplan views of the integrated circuit design. Thus, the functional element may be relocated throughout the floorplan without having to drag the functional element through multiple partial floorplan views.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 1A through 1E illustrate successive display screen shots of progressively smaller areas of a floorplan of an integrated circuit in which various embodiments of the invention may be implemented on.

FIG. 4 illustrates an exemplary report capable of being obtained through the graphical user interface of FIG. 3.

DETAILED DESCRIPTION

An invention is described for a system and method for relocating functional elements of a floorplan for an integrated circuit. It will be obvious, however, to one skilled in the art, that the present invention may be practiced without some or all of these specific details. In other instances, well known process operations have not been described in detail in order not to unnecessarily obscure the present invention.

A system and technique for moving one or more functional elements of a floorplan of an integrated circuit through a tray located outside of the floorplan is described below. As used herein, a functional element, also referred to as a logic cell, may be any suitable single or multiple block of logic, e.g., a register, a look up table, combinatorial logic, a logical array block, a logical element, an adaptive logic module (ALM), digital signal processor (DSP) blocks, trimatrix embedded memory blocks, such as M512, random access memory, M4K RAM, and MRAM, or any combination thereof, etc. In essence, a functional element may be any lower level logic block employed in an integrated circuit design. Additionally, the term floorplan refers to a display of the resulting placement of an integrated circuit design, i.e., the results of a place and route operation. For example, the floorplan may be the results of automated place and route software, such as the QUARTUS software owned by the assignee. A tray capable of temporarily storing the functional element selected from the floorplan enables the decoupling of dragging the functional element and scrolling through the floorplan. Thus, the designer is free to navigate through the floorplan much more efficiently. The functional element moved to the tray can then be assigned a new location within the floorplan once the designer has navigated to the new location.

Figure 1A:
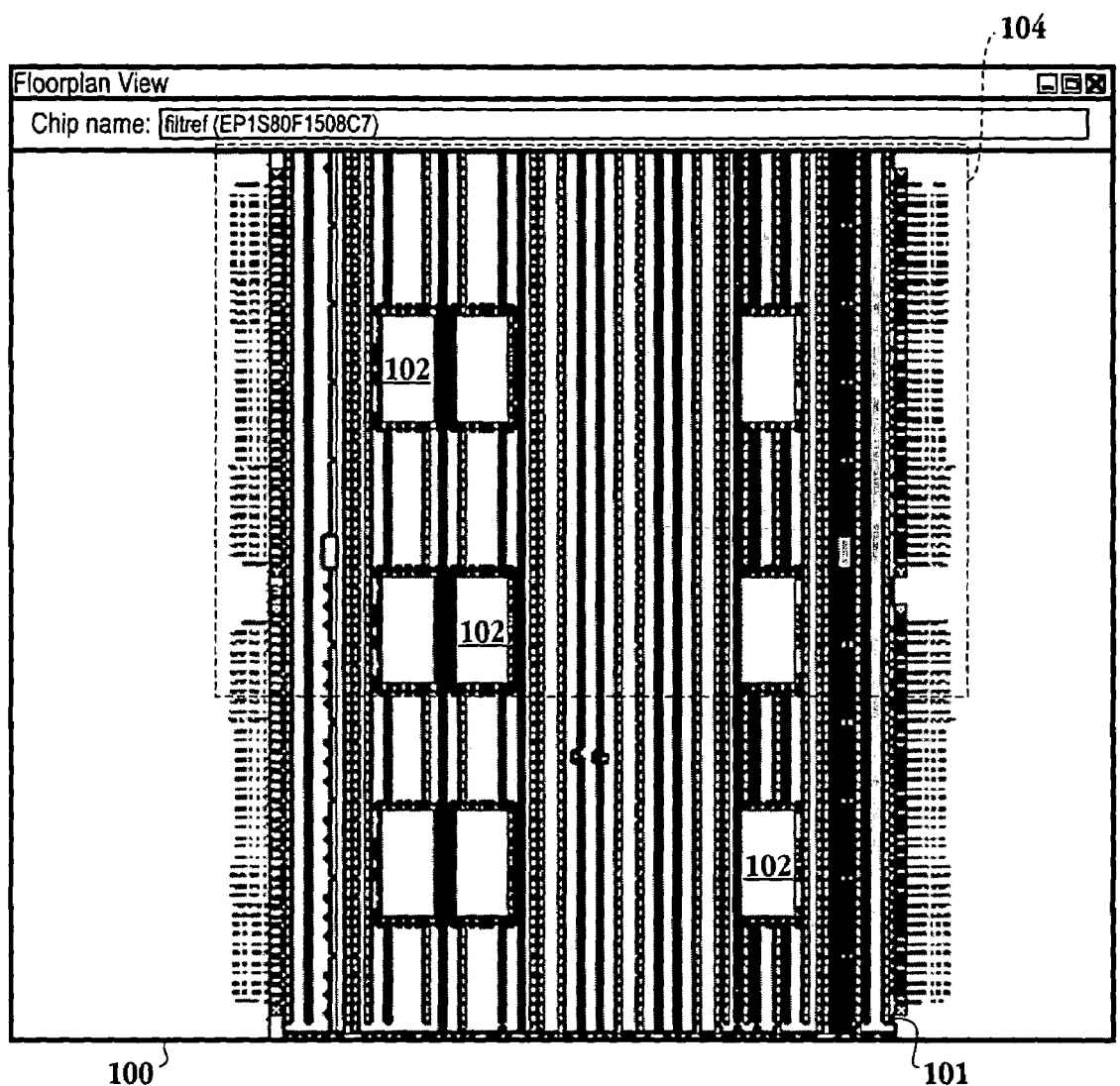
Figure 1B:
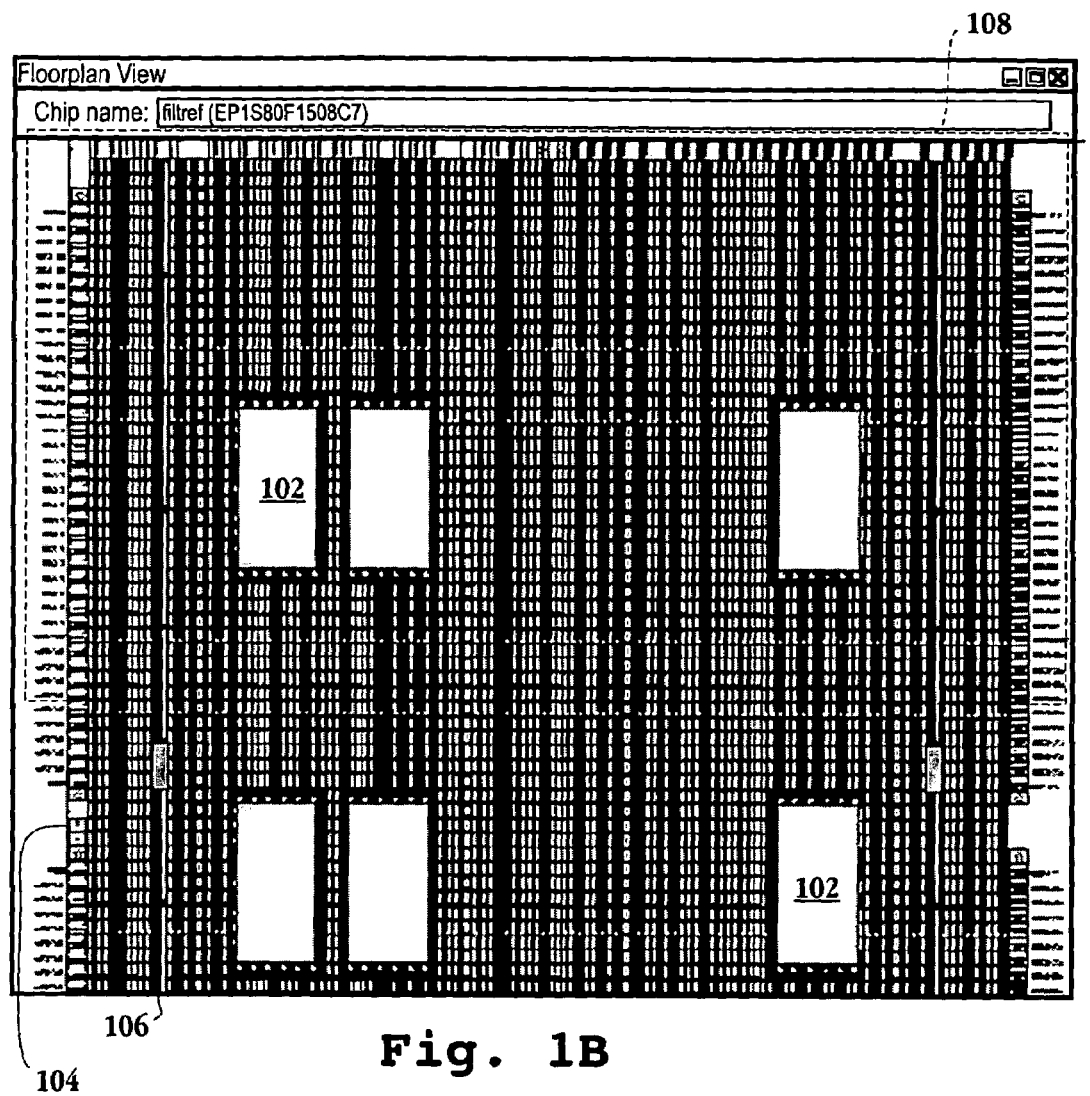
Figure 1C:
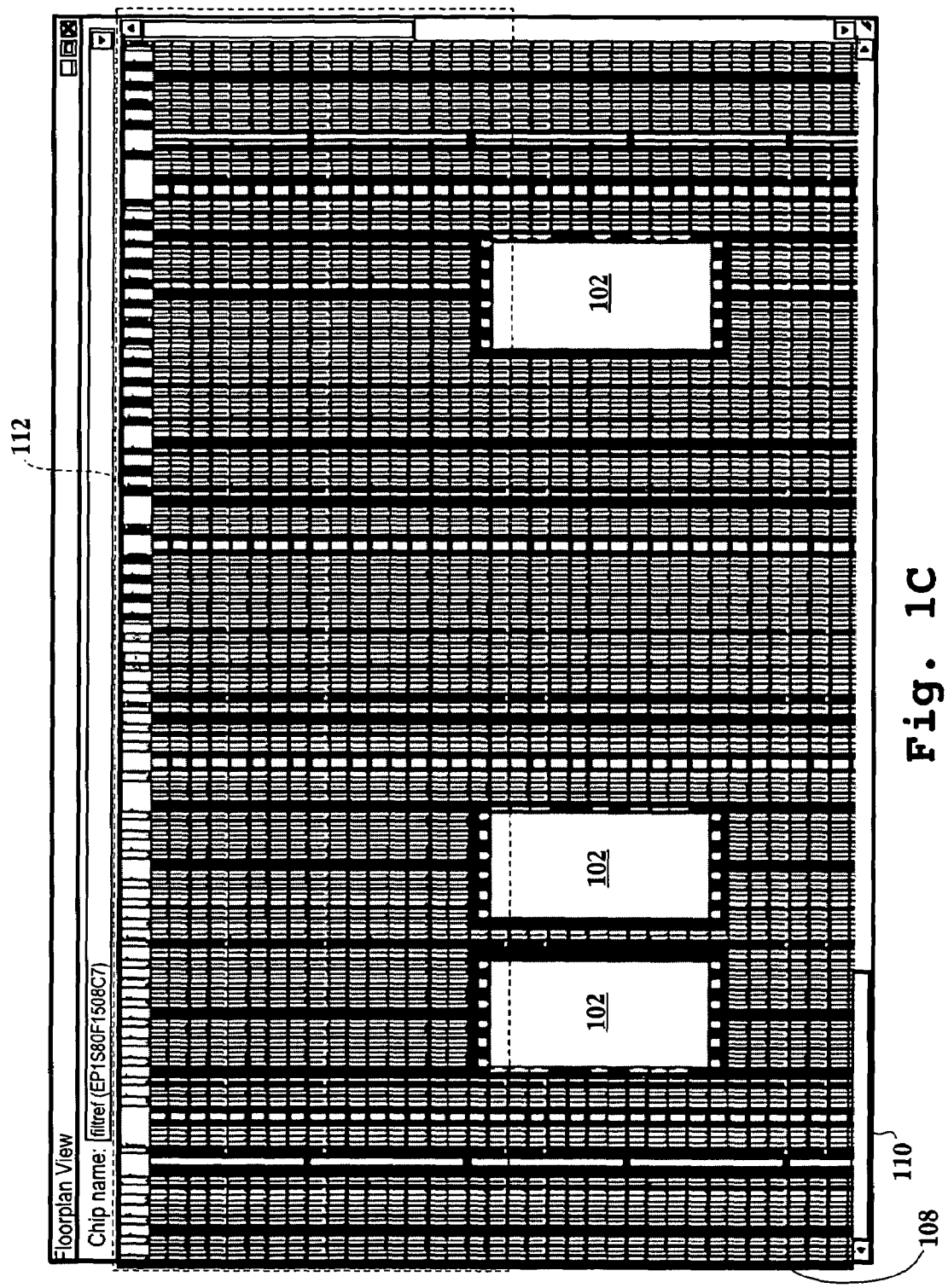

FIGS. 1A through 1E illustrate successive display screen shots of progressively smaller areas of a floorplan of an integrated circuit in which various embodiments of the invention may be implemented on. In FIG. 1A, graphical user interface 100 illustrates a high level representation of floorplan 101 of an exemplary integrated circuit. As can be seen, the resolution of floorplan 101 does not allow for visible discrimination between the components of the integrated circuit, except for memory regions 102. It should be appreciated that due to the relatively large area of the floorplan being displayed on the display device in FIG. 1A, the resolution of the individual functional elements is relatively poor. The integrated circuit of FIG. 1A is an exemplary layout for the STRATIX® product line owned by the Assignee. Region 104 of floorplan 101 is expanded in FIG. 1B. Moving to FIG. 1B, screen shot 106 illustrates the expanded view of region 104 of the floorplan. Here again, the visible discrimination between the components is limited to memory regions 102 from the remainder of the components of the integrated circuit even though a smaller area is displayed in FIG. 1B, as compared to FIG. 1A. Region 108 is further expanded in FIG. 1C. FIG. 1C illustrates screen shot 110 of region 108. While the expanded view in screen shot 110 is beginning to illustrate some of the components of the integrated circuit, the visible discrimination is still limited to memory regions 102. Region 112 is further expanded in FIG. 1D.

Figure 1D:
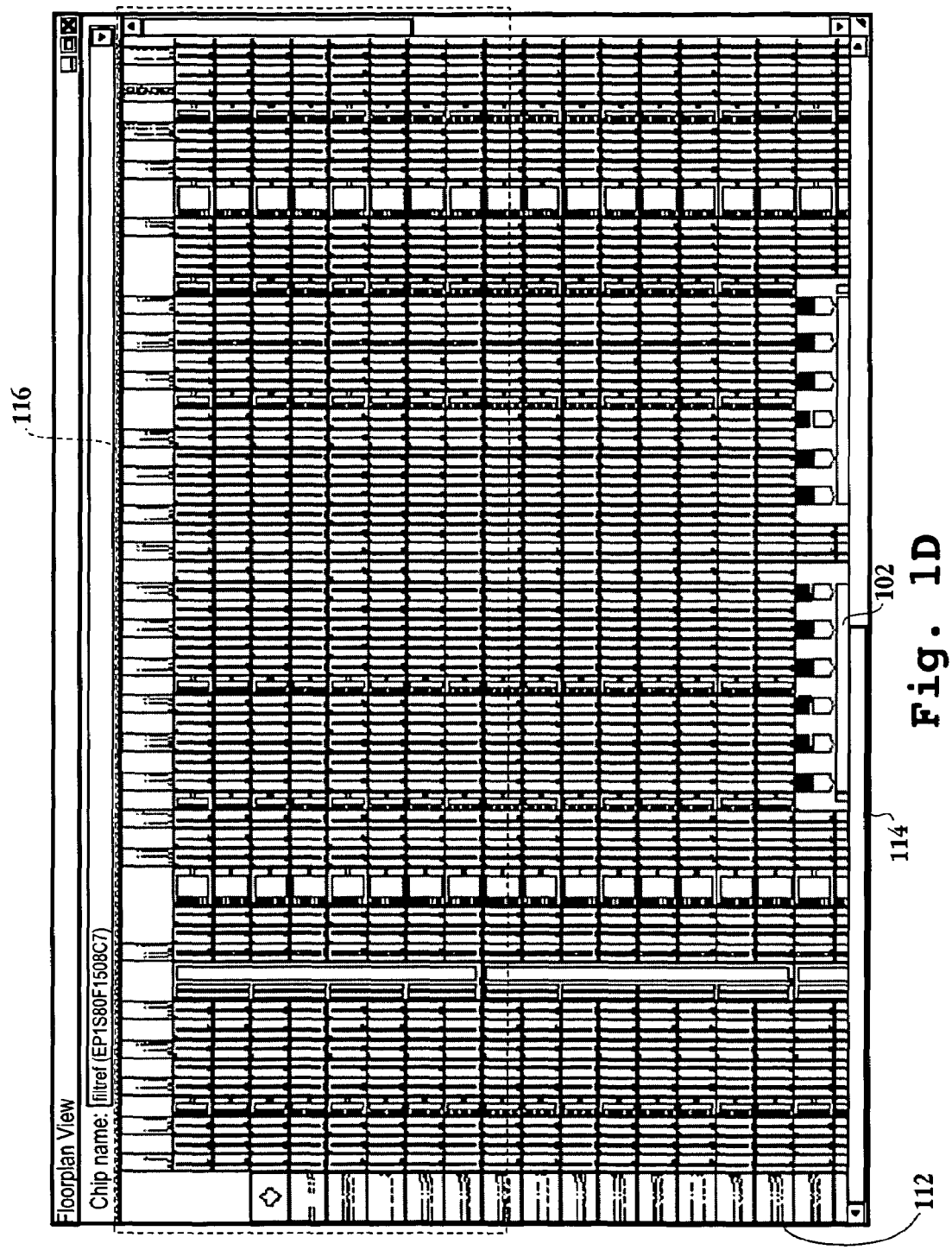
Figure 1E:
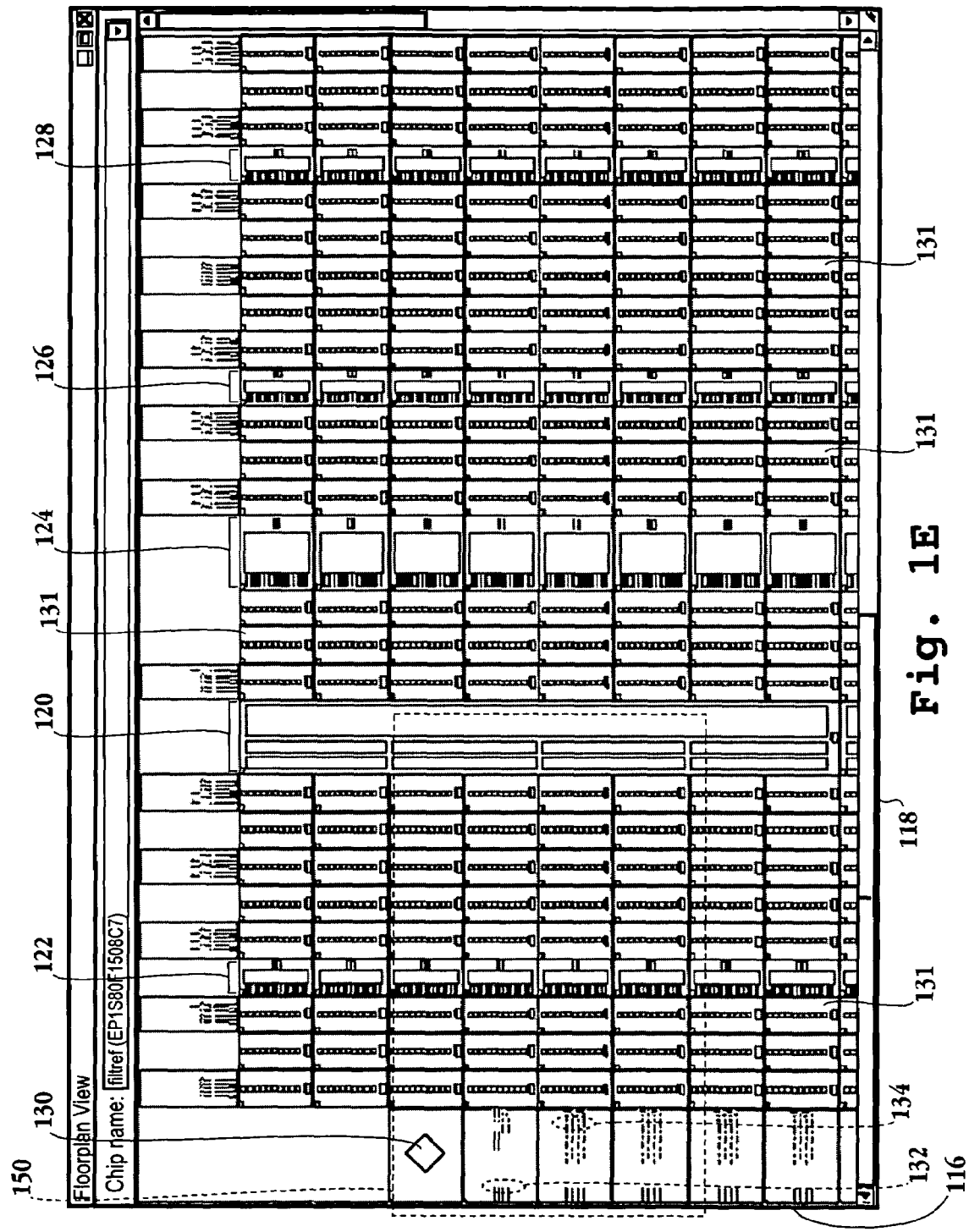

FIG. 1D illustrates screen shot 114 having the expanded view of region 112 on a suitable display device. Here, some of the functional elements, e.g., logical array blocks (LAB), are beginning to become visible but only as solid blocks. Region 116 is further expanded in FIG. 1E. FIG. 1E illustrates screen shot 118 having the expanded view of region 116. Here, some of the functional elements within the integrated circuit design are beginning to become visible. For example, memory regions 122, 124, 126 and 128 are becoming recognizable at this zoom-in level.

In the exemplary floorplan layout of screen shot 118 of FIG. 1E, column 120 may be used for a digital signal processor. Phase lock loop (PLL) 130 is also visibly discernable at this point. Region 132 includes input output pins for use in connecting the integrated circuit to an external device or devices. Region 134 includes registers, which are barely becoming visible at this zoom-in level. As can be seen in blocks 131, the logical array blocks and logical elements are beginning to be viewable at this point. Thus, FIG. 1A through 1E illustrate the successive zoom levels needed in order to visibly view the functional elements of a floorplan. Therefore, only a portion of the floorplan may be viewed at a time on a display screen for an engineer during the design phase of an integrated circuit. As will be illustrated with reference to FIG. 3, region 150 is displayed within a floorplan window to further zoom-in to a portion of the integrated circuit design. It should be appreciated that while the embodiments described with reference to FIGS. 1A–1E illustrate a design for a field programmable gate array (FPGA), this is not meant to be limiting. The embodiments described herein may be applied to any suitable integrated circuit and are not limited to FPGAs.

Figure 2:
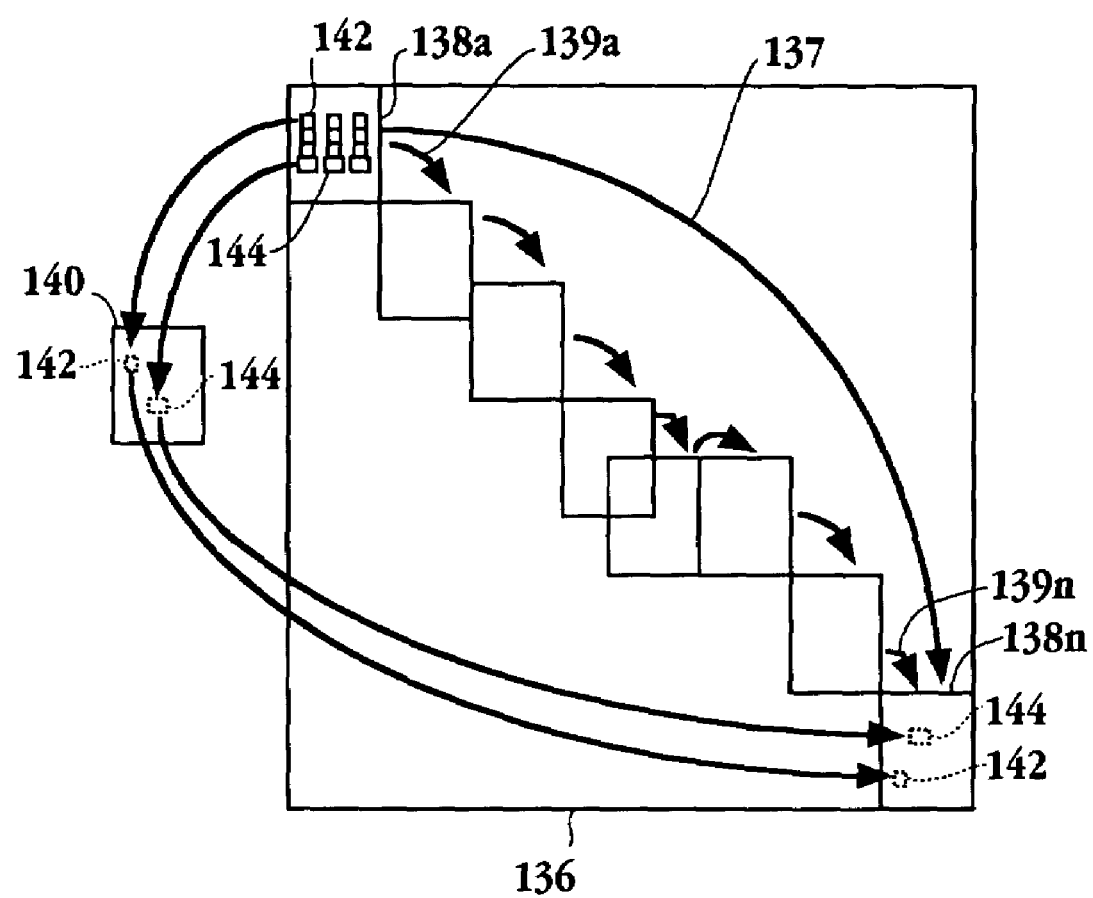
FIG. 2 is a simplified schematic diagram illustrating the convenience of a tray region for use in optimizing a compiled floorplan in accordance with one embodiment of the invention.

FIG. 2 is a simplified schematic diagram illustrating the convenience of a tray region for use in optimizing a compiled floorplan in accordance with one embodiment of the invention. Region 136 represents the entire floorplan view of the integrated circuit. Regions 138a through 138n are the views in an appropriate zoom-in level, e.g., the zoom level of FIG. 1E, FIG. 3, or a higher zoom-in level, to enable a designer to view the functional elements and access the functional elements on a display monitor. Thus, in order for a designer to view logical array blocks 144 and logical elements 142, a single zoomed-in portion of the entire floorplan must be viewed at a time. When attempting to move a logical cell from one end of the floorplan to the other, instead of performing an operation requiring to drag the logical cell through multiple scrolled of the floorplan, the logical cell may be dropped into tray 140. Accordingly, tray 140 acts as a temporary holding area in which multiple groups of functional elements may be placed into. Thus, a designer may then navigate to the area of the floorplan to relocate the logical cell without having to worry about dragging along the logical cell. This frees the designer to use alternative navigation techniques that are faster than the slow-scroll required when dragging the functional element. Once the area in which the logical cell is to be placed is reached, then the designer may grab the logical cell from tray 140 and assign the address of the new location to the logical cell. Regions 138a–n are shown for illustrative purposes and are not meant to imply that a designer may jump window by window through floorplan 136. Even through each of regions 138a–n, the designer must scroll through the corresponding region cell by cell, which is a slow process. Thus, just to move an element through one or two of the regions is an arduous task.

As illustrated in FIG. 2, logical array block 144 and logical element 142 are moved into tray 140 and then the designer advances to screen view 138n. The designer then takes the logical element or logical array block and drops them into a new location within screen view area 138n. As illustrated by line 137, the designer may navigate to the far end of the floorplan in a single step, e.g., through a go to function, a keystroke, page up and down, or another suitable input command through a mouse, e.g., scroll wheel mouse, or other input device. Alternatively, the designer may be able to display a high level view, e.g., FIG. 1A, of the design with a transparent box indicating the current area being viewed in the design. The designer can then select a different area of the design from the high level view. It should be appreciated that the tray region eliminates the restricted scrolling technique that advances cell-by-cell as illustrated through lines 136a–136n.

It should be appreciated that the design of the integrated circuit is being optimized at this point. That is, a placement and routing operation has been performed, e.g., through commercially available software. However, some routing schemes may have to be optimized by hand. Tray 140 enables a designer to more efficiently fine-tune their design by making it easier for them to hand place the logic. As explained below, the placement and routing results may be fixed, i.e., back annotated, prior to moving any functional elements.

Figure 3:
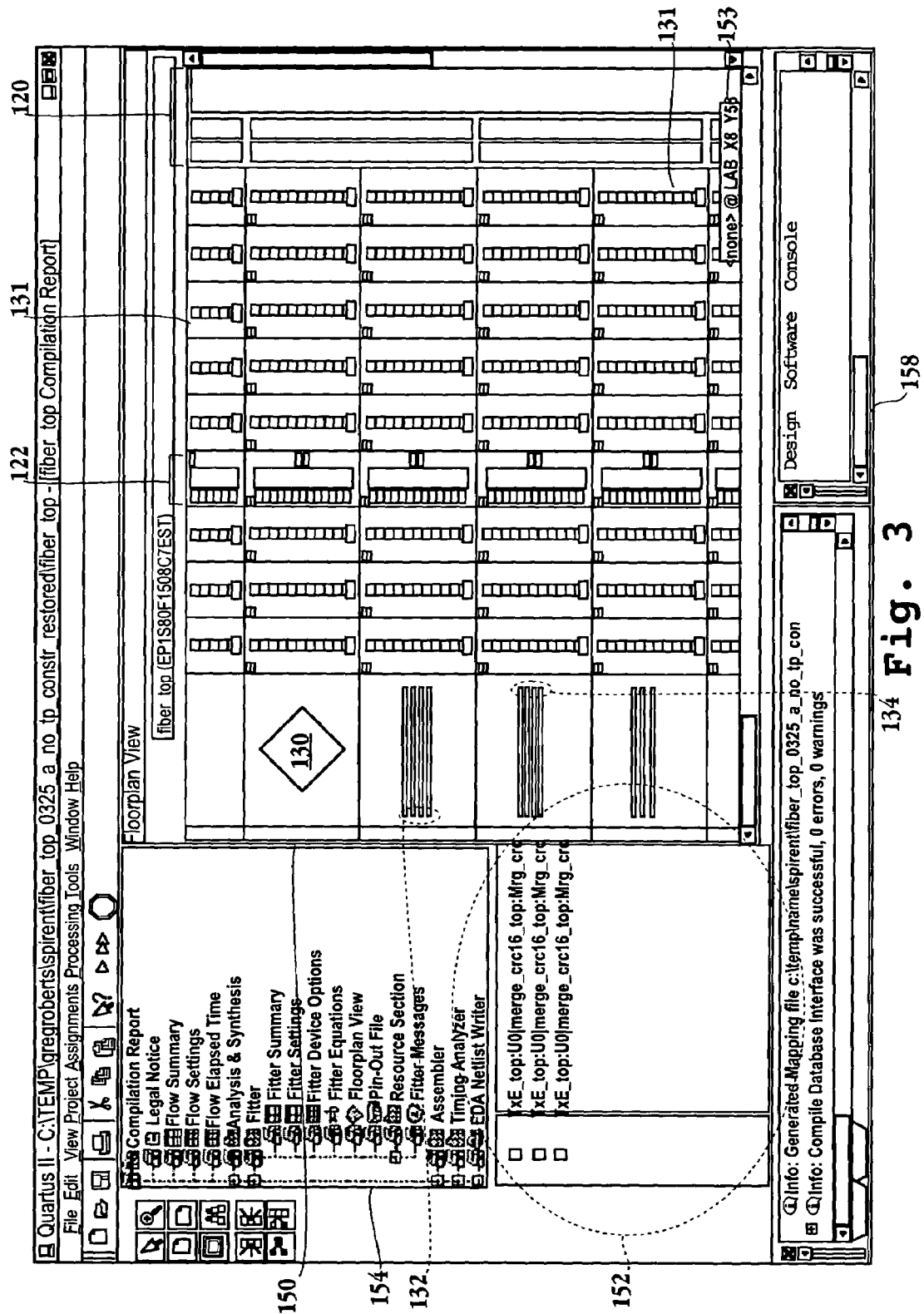
FIG. 3 is a simplified schematic view of an exemplary graphical user interface (GUI) enabling the temporary storage of functional elements to be hand placed in a floorplan of an integrated circuit in accordance with one embodiment of the invention.

FIG. 3 is a simplified schematic view of an exemplary graphical user interface (GUI) enabling the temporary storage of functional elements to be hand placed in a floorplan of an integrated circuit in accordance with one embodiment of the invention. GUI 158 illustrates floorplan view in window 150 where the functional elements are more easily viewed due to the further zoom-in level from the view of FIG. 1E. As illustrated in window 150 DSP region 120 and memory region 122 are clearly seen. Additionally, the logical array blocks and logical elements in regions 131 are clearly viewable and accessible to the designer, as well as the pins in region 132 and registers of region 134. Thus, should a designer wish to move one of the functional elements from an area within window 150 to an area anywhere else within the floorplan that is not viewable in window 150, the designer may transfer the functional element to tray region 152. Of course, the designer may transfer multiple functional elements into tray region 152 rather than a single functional element. Each of these transferred functional elements may then be transferred to the same area or different areas of the floorplan. It should be appreciated that a cursor or some other visible means may be used to select a logical element, logical array block or other functional element of the floorplan. The coordinates of the cursor within window 150 may be tracked through a Cartesian coordinate system associated with window 150, as illustrated in box 153. Window 154 of GUI 158 includes various reports, which may be selected by a user to view. Various navigational, editorial and other functional buttons are illustrated within GUI 158 in order to assist the chip designer in finalizing and evaluating the floorplan. For example, there could be additional information incorporated as part of the tray, where the additional information includes the original location of each LCELL, fan in, fan out, etc.

Figure 4:
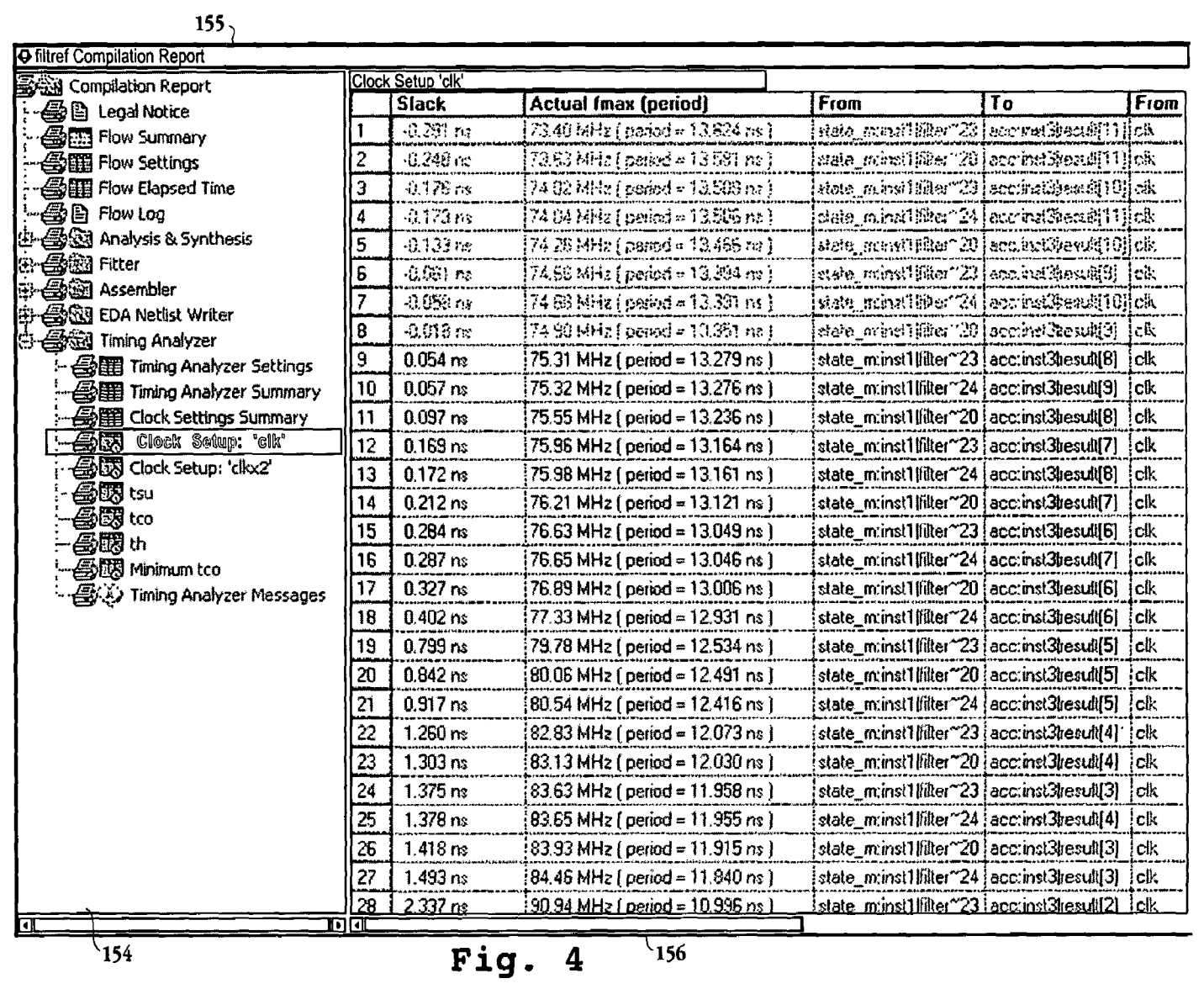

FIG. 4 illustrates an exemplary report capable of being obtained through the graphical user interface of FIG. 3. Here, screen shot 155 of FIG. 4 illustrates a timing analysis for the floorplan associated with FIG. 3. As can be seen, the first eight rows within window 156 are associated with negative times. The negative time indicates that the paths corresponding to these times are failing paths. That is, the placement of the elements associated with this path must be changed in order to achieve a positive time thereby resulting in the correct functionality of the design. Here, a designer may have to hand place the elements in order to fine-tune the design. Through the use of the tray discussed above with reference to FIG. 3, the hand placement of these elements becomes more much efficient. In window 154 of FIG. 4, various compilation reports associated with the resulting floorplan are illustrated.

Figure 5:
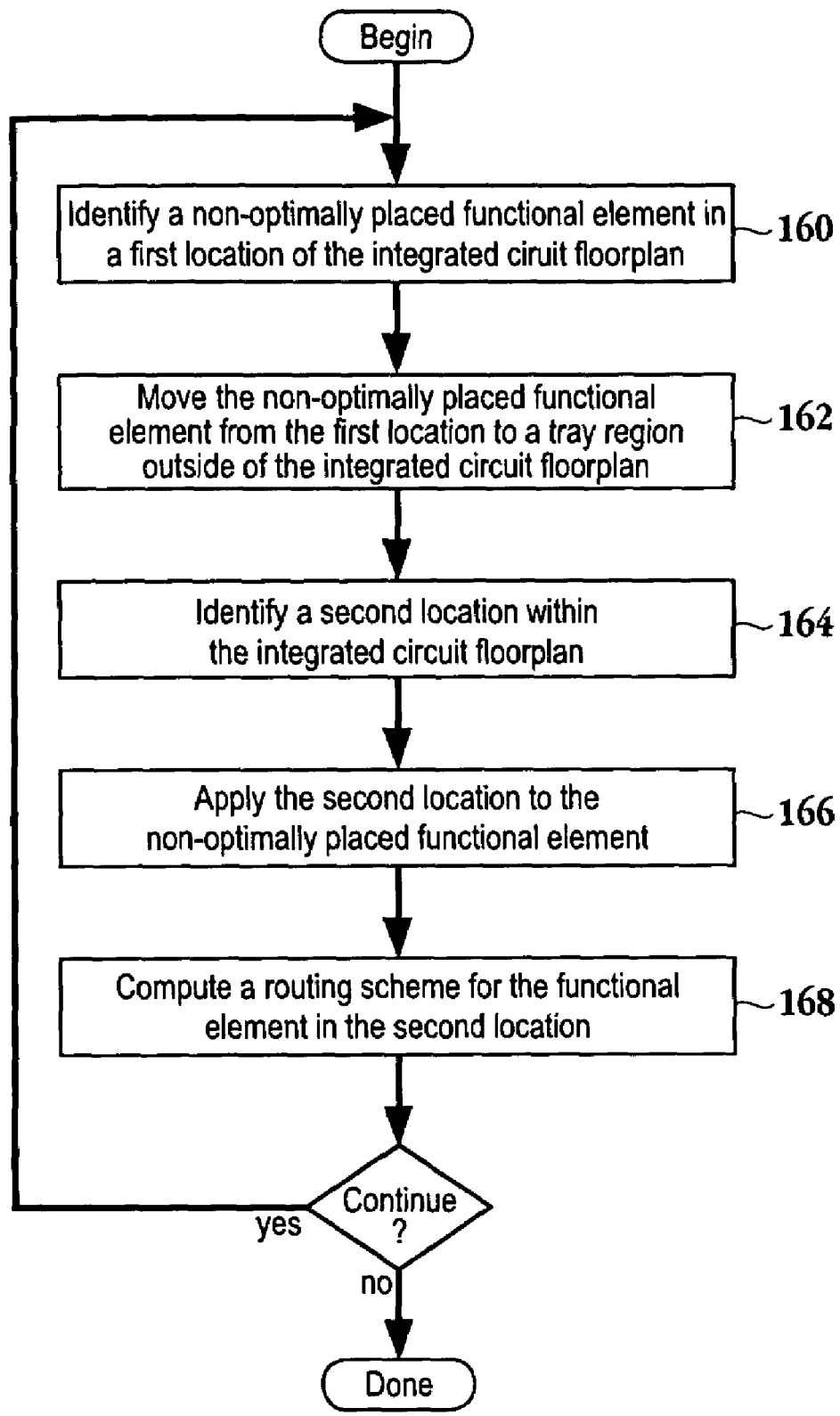
FIG. 5 is a flow chart diagram illustrating the method operations for modifying a compiled integrated circuit floorplan in accordance with one embodiment of the invention.

FIG. 5 is a flow chart diagram illustrating the method operations for modifying a compiled integrated circuit floorplan in accordance with one embodiment of the invention. The method initiates with operation 160 where a non-optimally placed functional element in a first location of the integrated circuit floorplan is identified. The non-optimally placed functional element may be identified through the results of a timing analysis as illustrated in the report of FIG. 4. Thus, after a placement and routing operation has been performed, e.g., through an automated software program, some fine-tuning of the floorplan may be necessary. This fine-tuning may include hand placement/movement of some functional elements in order to satisfy timing requirements. The method then advances to operation 162 where the non-optimally placed functional element is moved from the first location in a current view of the floorplan to a tray region outside of the integrated circuit floorplan. As illustrated with reference to FIG. 3, the functional element, which may include a logical cell, logical array block, register, pin, logical element, look-up table, etc., is moved from the current view of the partial floorplan to a temporary storage area outside of the floorplan. In one embodiment, the temporary storage area is the tray of FIG. 3.

The method of FIG. 5 then proceeds to operation 164 where a second location within the integrated circuit floorplan is identified. Here, a designer may navigate to a different view, i.e., a different location, within the integrated circuit floorplan without having to drag along the functional element to be moved. The method then moves to operation 166 where the second location is applied to the non-optimally placed functional element, which is temporarily stored in the tray. Here, the functional element from the tray may be dropped into the second location. As mentioned above, a Cartesian coordinate system within the window illustrating the second location may be used to track the placement of a cursor dragging the functional element into the second location. Thus, the position associated with the cursor where the designer releases the functional element, through a mouse click or other suitable input device, is assigned to the functional element.

The method of FIG. 5 then advances to operation 168 where the routing scheme for the functional element in the second location is computed. In one embodiment, the routing scheme may be computed only for the change that happens due to the movement of the functional element. For example, prior to moving the functional element from the first location, the integrated circuit floorplan may be fixed, i.e., back annotated. In essence, this stores the floorplan prior to moving the functional element. Thus, only the changed portions of the floorplan, i.e., those affected by the move, need to be recompiled in order to compute the routing scheme for the functional element in the second location in this embodiment. Of course, a full compilation may be executed on the entire floorplan in the alternative. From operation 168, the method may return to operation 160 and repeat as described above to relocate additional functional elements. Alternatively, the method may terminate upon the execution of operation 168.

Figure 6:
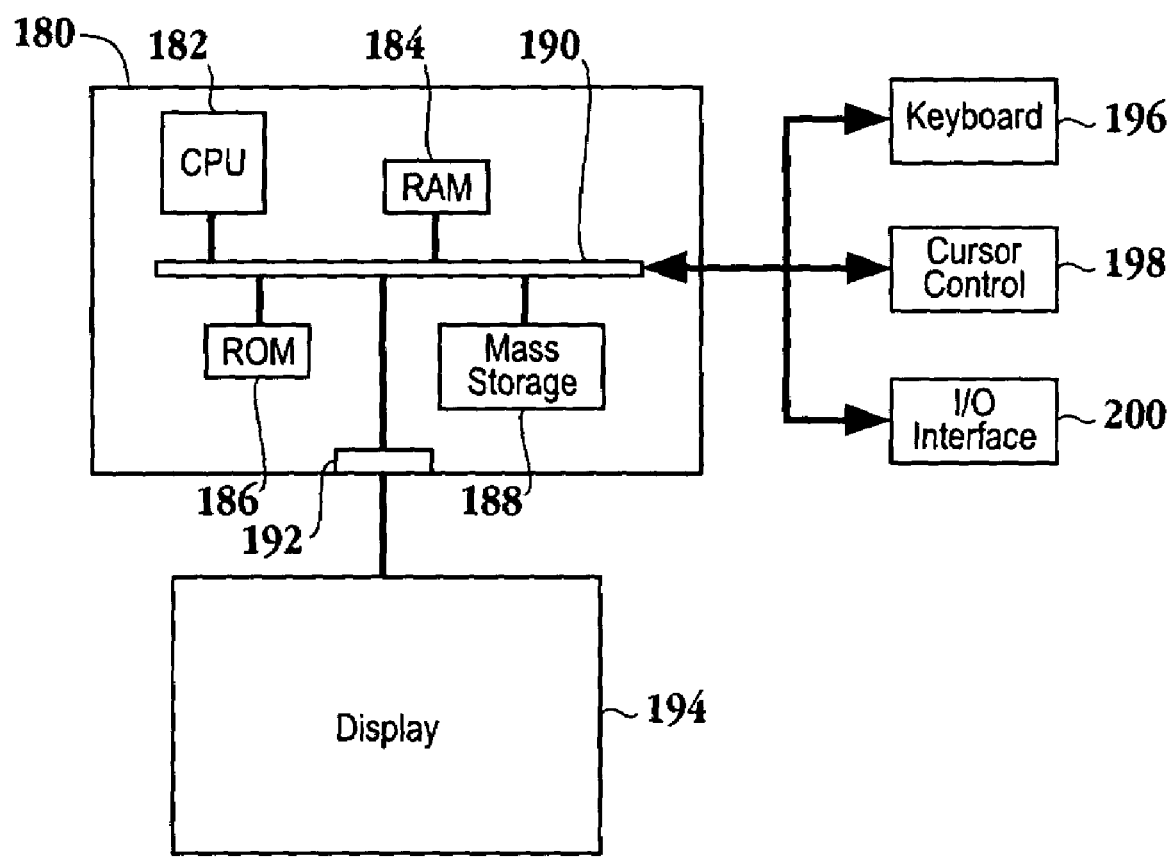
FIG. 6 is a simplified schematic diagram of a system, which may implement embodiments of the present invention.

FIG. 6 is a simplified schematic diagram of a system, which may implement embodiments of the present invention. It should be appreciated that the methods described herein may be performed with a digital processing system, such as a conventional, general-purpose computer system. Special purpose computers, which are designed or programmed to perform only one function may be used in the alternative. In addition, the computer system of FIG. 6 may be used to perform synthesis of a design that is described in a hardware description language. The computer system includes a central processing unit (CPU) 182, which is coupled through bus 190 to random access memory (RAM) 184, read-only memory (ROM) 186, and mass storage device 188. Mass storage device 188 represents a persistent data storage device such as a floppy disc drive or a fixed disc drive, which may be local or remote. It should be appreciated that CPU 182 may be embodied in a general-purpose processor, a special purpose processor, or a specially programmed logic device. Display 194 is in communication with CPU 182, RAM 184, ROM 186, and mass storage device 188, through bus 190 and display interface 192. Of course, display 194 is configured to display the user interfaces described herein. Keyboard 196, cursor control 198, and input/output interface 200 are coupled to bus 190 in order to communicate information in command selections to CPU 182. It should be appreciated that data to and from external devices may be communicated through input output interface 200. CPU 182 would execute the functionality described herein to enable a designer to temporarily store a functional element within the tray region.

In summary, the above-described invention provides a method and system for optimizing the floorplan of an integrated circuit design after a floorplan has been provided through a placement and routing operation. A tray located outside of the floorplan window is configured to temporarily store the functional element. In this manner, the designer can efficiently navigate to the area of the floorplan where the functional element is to be placed. Once this area is being displayed, the designer can obtain the functional element from the tray and place it into the area.

The integrated circuit design being optimized through the above-described embodiments may be incorporated into a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general purpose machines may be used with computer programs written in accordance with the teachings herein, or it may be more convenient to construct a more specialized apparatus to perform the required operations. Additionally, the PLDs according to the present invention may be included in a processor that is part of an electronic system. The electronic system may be a digital computing system such as a general or special purpose computer, or a specialized digital switching network, or other processing system.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for modifying a compiled integrated circuit floorplan, comprising method operations of:
    identifying a non-optimally placed functional element in a first location of the integrated circuit floorplan;
    moving the non-optimally placed functional element from the first location to a tray region outside of the integrated circuit floorplan;
    identifying a second location within the integrated circuit floorplan;
    applying the second location to the non-optimally placed functional element; and
    computing a routing scheme for the functional element in the second location.

2. The method of claim 1, further comprising:
    preserving the compiled integrated circuit design prior to moving the non-optimally placed functional element.

3. The method of claim 1, wherein the compiled integrated circuit floorplan is presented through a graphical user interface.

4. The method of claim 3, wherein a distance between the first location and the second location prevents the first location and the second location from being visibly displayed on the graphical user interface at the same time.

5. The method of claim 1, wherein the method operation of identifying a non-optimally placed functional element in a first location of the integrated circuit floorplan includes,
    applying a route and place operation to a netlist representing the integrated circuit floorplan.

6. The method of claim 1, wherein the method operation of identifying a second location within the integrated circuit floorplan includes,
    scrolling to a region of a graphical user interface displaying the floorplan, the region containing the second location and not the first location.

7. A computer readable medium having program instructions for modifying a compiled integrated circuit floorplan, comprising:
    program instructions for selecting a non-optimally placed functional element in a first location of the integrated circuit floorplan;
    program instructions for moving the non-optimally placed functional element from the first location to a tray region outside of the integrated circuit floorplan;
    program instructions for identifying a second location within the integrated circuit floorplan;
    program instructions for applying the second location to the non-optimally placed functional element; and
    program instructions for recalculating a routing scheme for the functional element in the second location.

8. The computer readable medium of claim 7, further comprising:
    program instructions for preserving the compiled integrated circuit design prior to moving the non-optimally placed functional element.

9. The computer readable medium of claim 7, wherein a distance between the first location and the second location prevents the first location and the second location from being visibly displayed simultaneously on a graphical user interface displaying the floorplan.

10. The computer readable medium of claim 7, wherein the program instructions for selecting a non-optimally placed functional element in a first location of the integrated circuit floorplan includes,
    program instructions for applying a route and place operation to a netlist representing the integrated circuit floorplan.

11. The computer readable medium of claim 7, wherein the method operation of identifying a second location within the integrated circuit floorplan includes,
    program instructions for scrolling to a region of a graphical user interface displaying the floorplan, the region containing the second location and not the first location.

12. A computer implemented system for designing an integrated circuit, comprising:
    a bus;
    a memory;
    a monitor configured to display a floorplan of an integrated circuit and a tray region outside the floorplan;
    a processor in communication with the memory and the monitor through the bus, the processor operable to receive instructions which, when executed by the processor, cause the processor to perform a method comprising:
        identifying a non-optimally placed functional element in a first location of the floorplan;
        moving the non-optimally placed functional element from the first location to the tray region outside of the floorplan;
        identifying a second location within the floorplan;
        associating the second location with the non-optimally placed functional element; and
        recalculating a routing scheme for the functional element in the second location.

13. The system of claim 12, wherein the first location and the second location are incapable of being simultaneously presented within a portion of the floorplan on the monitor.

14. The system of claim 12, wherein the tray region is configured to store multiple functional elements from the floorplan of the integrated circuit.

* * * * *